(12) United States Patent
Liaw

(10) Patent No.: US 12,009,426 B2
(45) Date of Patent: *Jun. 11, 2024

(54) STRUCTURE AND METHOD FOR FinFET DEVICE WITH ASYMMETRIC CONTACT

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/827,457

(22) Filed: May 27, 2022

(65) Prior Publication Data

US 2022/0293792 A1 Sep. 15, 2022

Related U.S. Application Data

(60) Continuation of application No. 16/983,752, filed on Aug. 3, 2020, now Pat. No. 11,349,027, which is a (Continued)

(51) Int. Cl.
*H01L 29/94* (2006.01)
*H01L 21/762* (2006.01)
(Continued)

(52) U.S. Cl.
CPC .... *H01L 29/7848* (2013.01); *H01L 21/76229* (2013.01); *H01L 21/76816* (2013.01);
(Continued)

(58) Field of Classification Search
CPC .......... H01L 29/7848; H01L 21/76229; H01L 21/76816; H01L 21/823412; H01L 21/823431; H01L 21/823475; H01L 21/823481; H01L 27/0207; H01L 27/0629; H01L 29/0653; H01L 29/41791;
(Continued)

(56) References Cited

U.S. PATENT DOCUMENTS 8,772,109 B2 7/2014 Colinge
8,785,285 B2 7/2014 Tsai et al.
(Continued)

*Primary Examiner* — Theresa T Doan
(74) *Attorney, Agent, or Firm* — Haynes and Boone, LLP

(57) ABSTRACT

The present disclosure provides one embodiment of a method of forming an integrated circuit structure. The method includes forming a shallow trench isolation (STI) structure in a semiconductor substrate of a first semiconductor material, thereby defining a plurality of fin-type active regions separated from each other by the STI structure; forming gate stacks on the fin-type active regions; forming an inter-layer dielectric (ILD) layer filling in gaps between the gate stacks; patterning the ILD layer to form a trench between adjacent two of the gate stacks; depositing a first dielectric material layer that is conformal in the trench; filling the trench with a second dielectric material layer; patterning the second dielectric material layer to form a contact opening; and filling a conductive material in the contact opening to form a contact feature.

20 Claims, 24 Drawing Sheets

Related U.S. Application Data continuation of application No. 16/564,317, filed on Sep. 9, 2019, now Pat. No. 10,734,519, which is a continuation of application No. 16/043,510, filed on Jul. 24, 2018, now Pat. No. 10,411,130, which is a division of application No. 15/700,468, filed on Sep. 11, 2017, now Pat. No. 10,115,825.

(60) Provisional application No. 62/491,400, filed on Apr. 28, 2017.

(51) Int. Cl.
*H01L 21/768* (2006.01)
*H01L 21/8234* (2006.01)
*H01L 27/02* (2006.01)
*H01L 27/06* (2006.01)
*H01L 29/06* (2006.01)
*H01L 29/417* (2006.01)
*H01L 29/66* (2006.01)
*H01L 29/76* (2006.01)
*H01L 29/78* (2006.01)
*H01L 31/062* (2012.01)

(52) U.S. Cl.
CPC ........ *H01L 21/823412* (2013.01); *H01L 21/823431* (2013.01); *H01L 21/823475* (2013.01); *H01L 21/823481* (2013.01); *H01L 27/0207* (2013.01); *H01L 27/0629* (2013.01); *H01L 29/0653* (2013.01); *H01L 29/41791* (2013.01); *H01L 29/66795* (2013.01); *H01L 29/785* (2013.01); *H01L 29/7851* (2013.01); *H01L 29/66545* (2013.01); *Y02E 10/50* (2013.01)

(58) Field of Classification Search
CPC ........ H01L 29/66795; H01L 29/785; H01L 29/7851; H01L 29/66545; H01L 21/76831; H01L 21/76897; H01L 27/0886; H01L 29/165; H01L 29/517; H01L 29/4966; H01L 29/6656; H01L 29/7846; H01L 29/7855
USPC .................................................. 257/401
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,115,825 B1 * | 10/2018 | Liaw ............... H01L 21/823481 |
| 10,734,519 B2 | 8/2020 | Liaw |
| 2007/0019479 A1 | 1/2007 | Kim et al. |
| 2011/0291292 A1 | 12/2011 | Frohberg |
| 2013/0320452 A1 | 12/2013 | Wann |
| 2016/0111543 A1 | 4/2016 | Fang et al. |
| 2016/0247876 A1 | 8/2016 | Chung et al. |
| 2016/0351570 A1 | 12/2016 | Park et al. |
| 2016/0359008 A1 | 12/2016 | Choi et al. |

\* cited by examiner

… (1)

STRUCTURE AND METHOD FOR FinFET DEVICE WITH ASYMMETRIC CONTACT

PRIORITY DATA

This application is a continuation patent application, claims the benefits of a continuation patent application of U.S. patent application Ser. No. 16/983,752, filed Aug. 3, 2020, a continuation patent application of U.S. patent application Ser. No. 16/564,317, filed Sep. 9, 2019, a divisional patent application of U.S. patent application Ser. No. 16/043,510, filed Jul. 24, 2018, an U.S. patent application Ser. No. 15/700,468, filed Sep. 11, 2017, and an U.S. Provisional Application 62/491,400 entitled "STRUCTURE AND METHOD FOR FINFET DEVICE WITH ASYMMETRIC CONTACT," filed Apr. 28, 2017, the entire disclosures of which are incorporated herein by reference.

BACKGROUND

Integrated circuits have progressed to advanced technologies with smaller feature sizes, such as 32 nm, 28 nm and 20 nm. In these advanced technologies, the gate pitch (spacing) continuously shrinks and therefore induces contact to gate bridge concern. Furthermore, three dimensional transistors with fin-type active regions are often desired for enhanced device performance. Those three-dimensional field effect transistors (FETs) formed on fin-type active regions are also referred to as FinFETs. FinFETs are required narrow fin width for short channel control, which leads to smaller top S/D regions than those of planar FETs. This will further degrade the contact to S/D landing margin.

Along with the scaling down of the device sizes, such as in deep micro technology, the contact size was continuously shrunk for high-density gate pitch requirement. To shrink the contact size without impacting contact resistance, the long contact shape was proposed for 32 nm and beyond technologies. Long contact shape allows tight width dimension on the gate pitch direction but increased length on the gate routing direction to extend both contact area for source/drain and exposure area in the lithography patterning process. Long contact shape can achieve both high gate density and lower contact resistance. However, there are concerns due to the space limitation of line-end side. In line end, the concerns include line-end shortening and line-end to line-end bridging, leading to either contact-to-fin active connection opening (shortening) or contact-to-contact leakage (bridging). To reduce the line end shortening improve, it requires a wider space rule or more aggressive reshaping by optical proximity correction (OPC) on the line end, which will impact the cell size or cause bridging in a given cell pitch. This is getting even worse on future fin-type transistors because fin-type active regions are very narrow.

Therefore, there is a need for a structure and method for fin-type transistors and contact structure to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
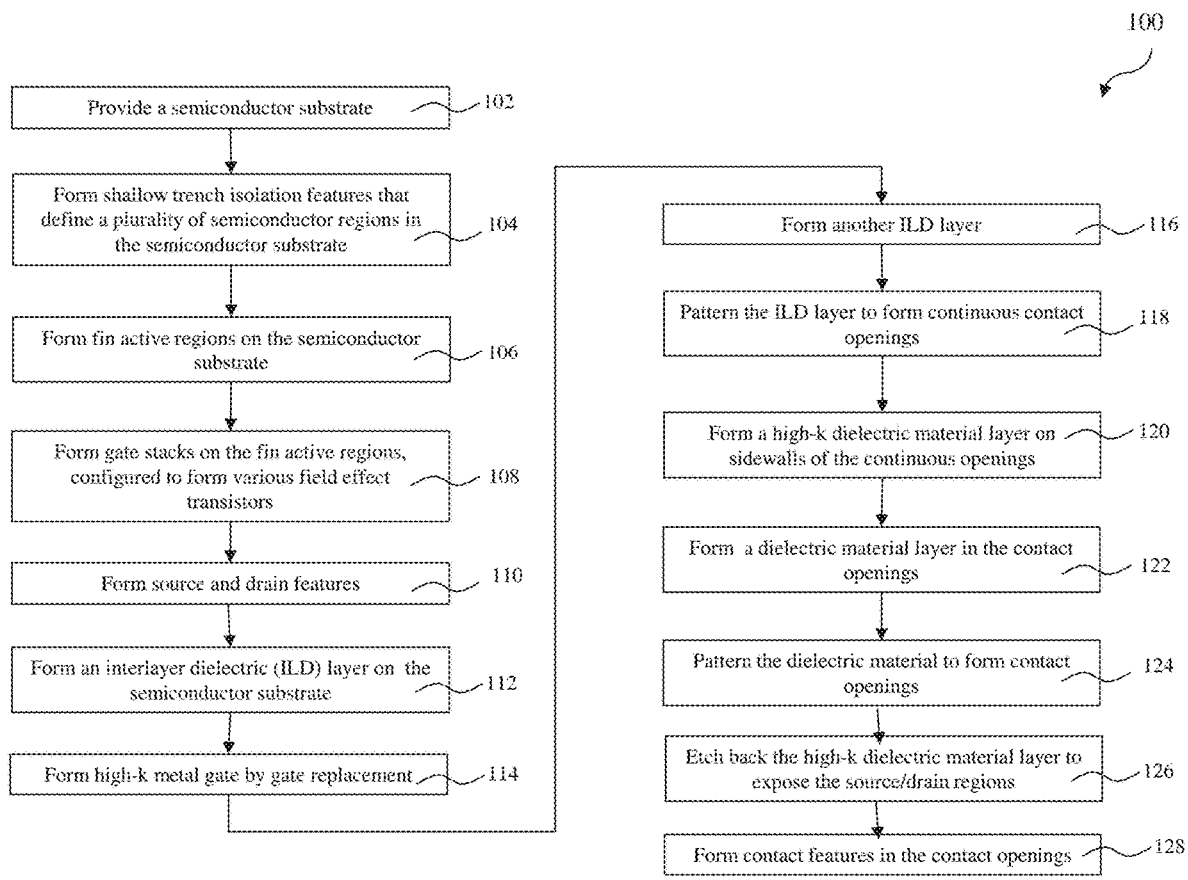
FIG. 1 is a flowchart of a method making a semiconductor structure having a multi-fin structure constructed according to various aspects of the present disclosure in some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact and may also include embodiments in which additional features may be formed interposing the first and second features, such that the first and second features may not be in direct contact.

FIG. 1 is a flowchart 100 for fabricating a semiconductor structure having fin-type transistors and elongated contact features constructed according to some embodiments. FIGS. 2 through 15 are top or sectional views of a semiconductor structure 200 at various fabrication stages. The semiconductor structure 200 includes fin-type transistors and elongated contact features with asymmetric design in accordance with some embodiments. The semiconductor structure 200 and the method 100 making the same are collectively described below with reference to FIGS. 1 through 15.

Figure 2:
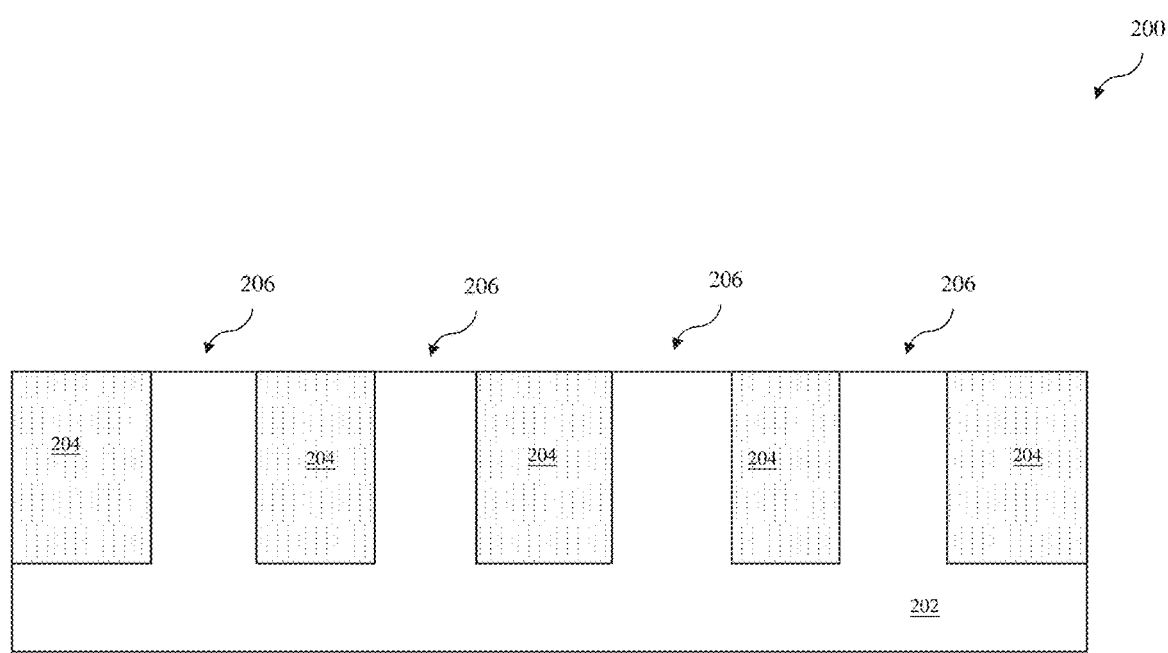
FIGS. 2, 3A, 4A, 4C, 5, 6, 7, 9, 10B, 11B, 12, 13B, 14, and 15A are sectional views of a semiconductor structure at various fabrication stages constructed according to some embodiments.
Figure 2:
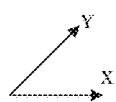

Referring to FIG. 2, the method 100 begins with block 102 by providing a semiconductor substrate 202. The semiconductor substrate 202 includes silicon. In some other embodiments, the substrate 202 includes germanium, silicon germanium or other proper semiconductor materials. The substrate 202 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor substrate 202 also includes various doped regions such as n-well and p-wells. In one embodiment, the semiconductor substrate 202 includes an epitaxy (or epi) semiconductor layer. In another embodiment, the semiconductor substrate 202 includes a buried dielectric material layer for isolation formed by a proper technology, such as a technology referred to as separation by implanted oxygen (SIMOX). In some embodiments, the substrate 202 may be a semiconductor on insulator, such as silicon on insulator (SOI).

Still referring to FIG. 2, the method 100 proceeds to an operation 104 by forming shallow trench isolation (STI) features 204 on the semiconductor substrate 202. In some embodiments, the STI features 204 are formed etching to form trenches, filling the trenches with dielectric material and polishing to remove the excessive dielectric material and planarize the top surface. One or more etching processes are performed on the semiconductor substrate 202 through openings of soft mask or hard mask, which are formed by lithography patterning and etching. The formation of the STI features 204 are further described below in accordance with some embodiments.

In the present example, a hard mask is deposited on the substrate 202 and is patterned by lithography process. The hard mask layers include a dielectric such as semiconductor oxide, semiconductor nitride, semiconductor oxynitride, and/or semiconductor carbide, and in an exemplary embodiment, the hard mask layer include a silicon oxide film and a silicon nitride film. The hard mask layer may be formed by thermal growth, atomic layer deposition (ALD), chemical vapor deposition (CVD), high density plasma CVD (HDP-CVD), other suitable deposition processes.

A photoresist layer (or resist) used to define the fin structure may be formed on the hard mask layer. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning.

In one embodiment, the resist layer is patterned to leave the portions of the photoresist material disposed over the semiconductor structure 200 by the lithography process. After patterning the resist, an etching process is performed on the semiconductor structure 200 to open the hard mask layer, thereby transferring the pattern from the resist layer to the hard mask layer. The remaining resist layer may be removed after the patterning the hard mask layer. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer may include wet etching, dry etching or a combination thereof. The etching process may include multiple etching steps. For example, the silicon oxide film in the hard mask layer may be etched by a diluted hydrofluorine solution and the silicon nitride film in the hard mask layer may be etched by a phosphoric acid solution.

Then etching process may be followed to etch the portions of the substrate 102 not covered by the patterned hard mask layer. The patterned hard mask layer is used as an etch mask during the etching processes to pattern the substrate 202. The etching processes may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density. In some examples, the semiconductor material of the substrate may be etched by a dry etching process using a fluorine-based etchant. Particularly, the etching process applied to the substrate is controlled such that the substrate 202 is partially etched. This may be achieved by controlling etching time or by controlling other etching parameter(s). After the etching processes, the fin structure 206 with fin active regions is defined on and extended from the substrate 102.

One or more dielectric material is filled in the trenches to form the STI feature 204. Suitable fill dielectric materials include semiconductor oxides, semiconductor nitrides, semiconductor oxynitrides, fluorinated silica glass (FSG), low-K dielectric materials, and/or combinations thereof. In various exemplary embodiments, the dielectric material is deposited using a HDP-CVD process, a sub-atmospheric CVD (SACVD) process, a high-aspect ratio process (HARP), a flowable CVD (FCVD), and/or a spin-on process.

The deposition of the dielectric material may be followed by a chemical mechanical polishing/planarization (CMP) process to remove the excessive dielectric material and planarize the top surface of the semiconductor structure. The CMP process may use the hard mask layers as a polishing stop layer to prevent polishing the semiconductor layer 202. In this case, the CMP process completely removes the hard mask. The hard mask may be removed alternatively by an etching process. Although in further embodiments, some portion of the hard mask layers remain after the CMP process.

Figure 3A:
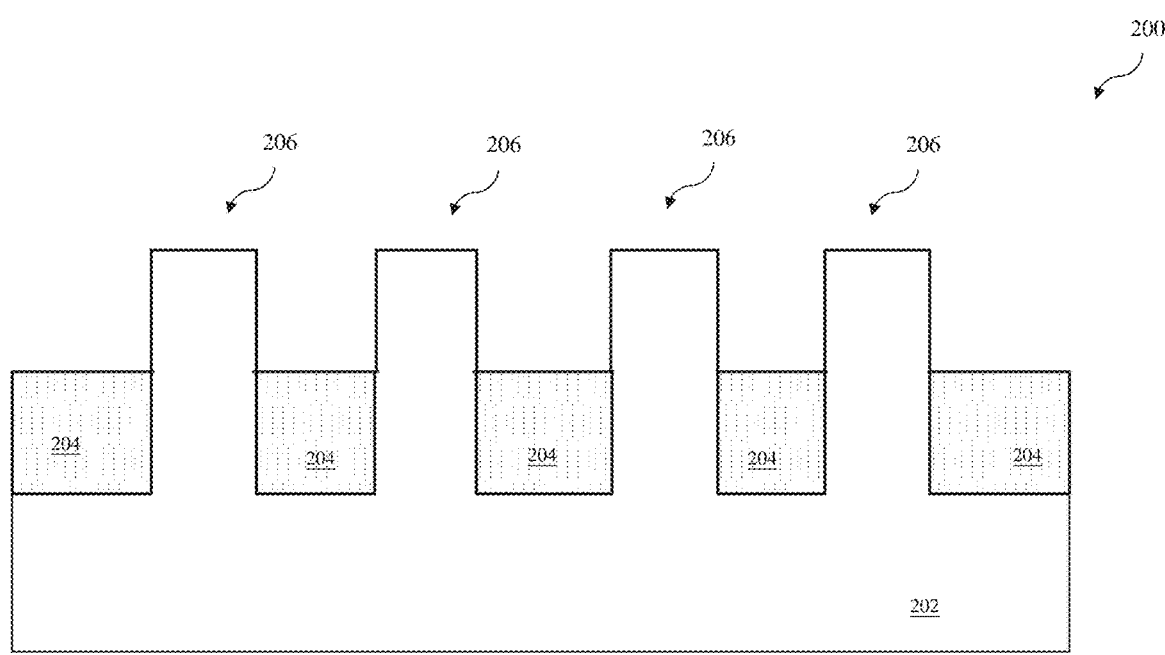
Figure 3A:
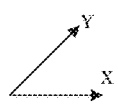
Figure 3B:
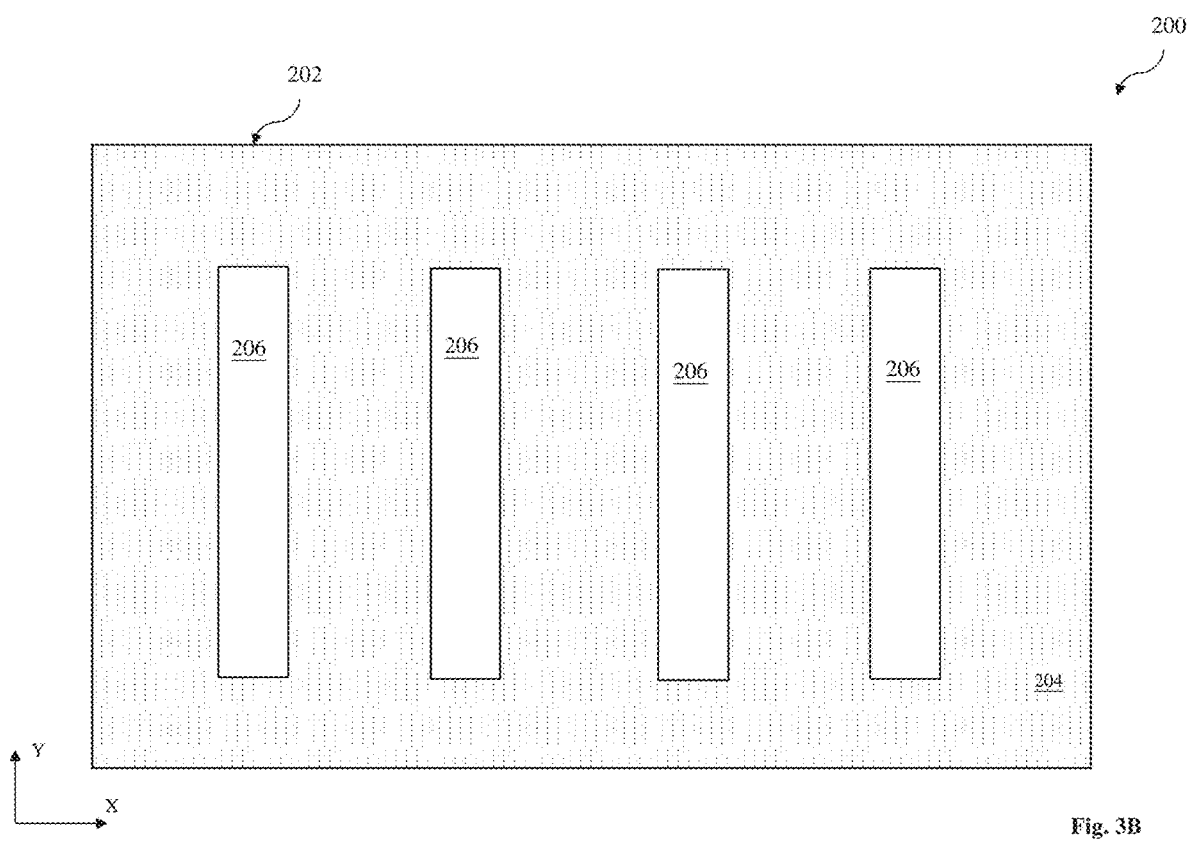
FIGS. 3B, 4B, 10A, 11A, 13A, 13C and 15B are top views of a semiconductor structure at various fabrication stages constructed according to some embodiments.

Referring to FIGS. 3A and 3B, the method 100 proceeds to an operation 106 by forming the fin structure 206 having multiple fin active regions (or fin features). The operation 106 includes recessing the STI features 204 such that the fin active regions 206 are extruded above from the STI features 204. The recessing process employs one or more etching steps (such as dry etch, wet etch or a combination thereof) to selectively etch back the STI features 204. For example, a wet etching process using hydrofluoric acid may be used to etch when the STI features 204 are silicon oxide. FIG. 3B is a top view of the semiconductor structure 200. Exemplary fin active regions 206 are spaced from each in a first direction (X direction). The fin active regions 206 have elongated shape and oriented along a second direction (Y direction), which is orthogonal with the X direction.

Various doping processes may be applied to the semiconductor regions to form various doped wells, such as n-wells and p-wells at the present stage or before the operation 106. Various doped wells may be formed in the semiconductor substrate by respective ion implantations.

Figure 4A:
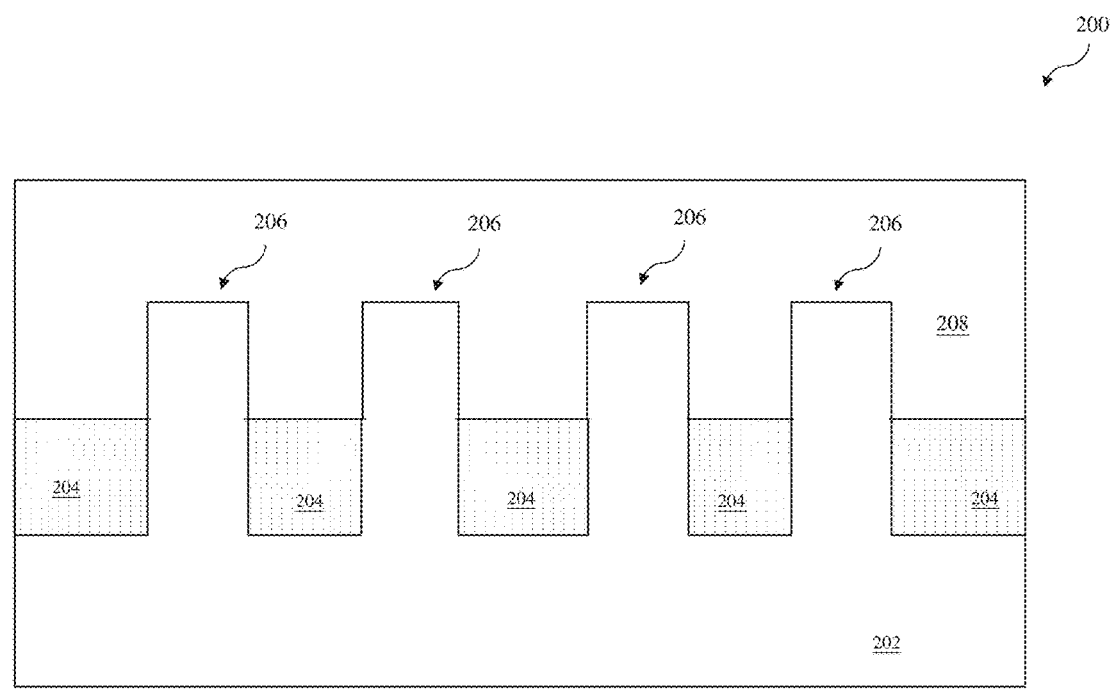
Figure 4B:
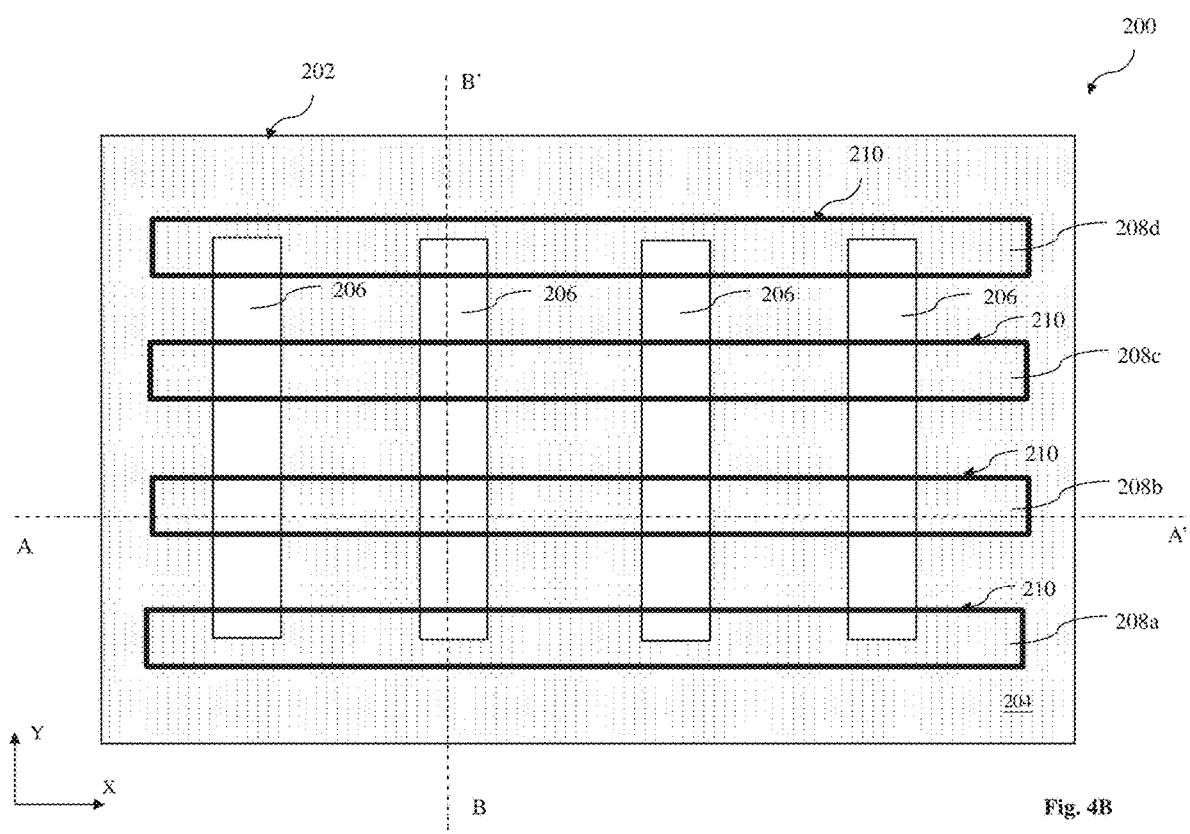
Figure 4C:
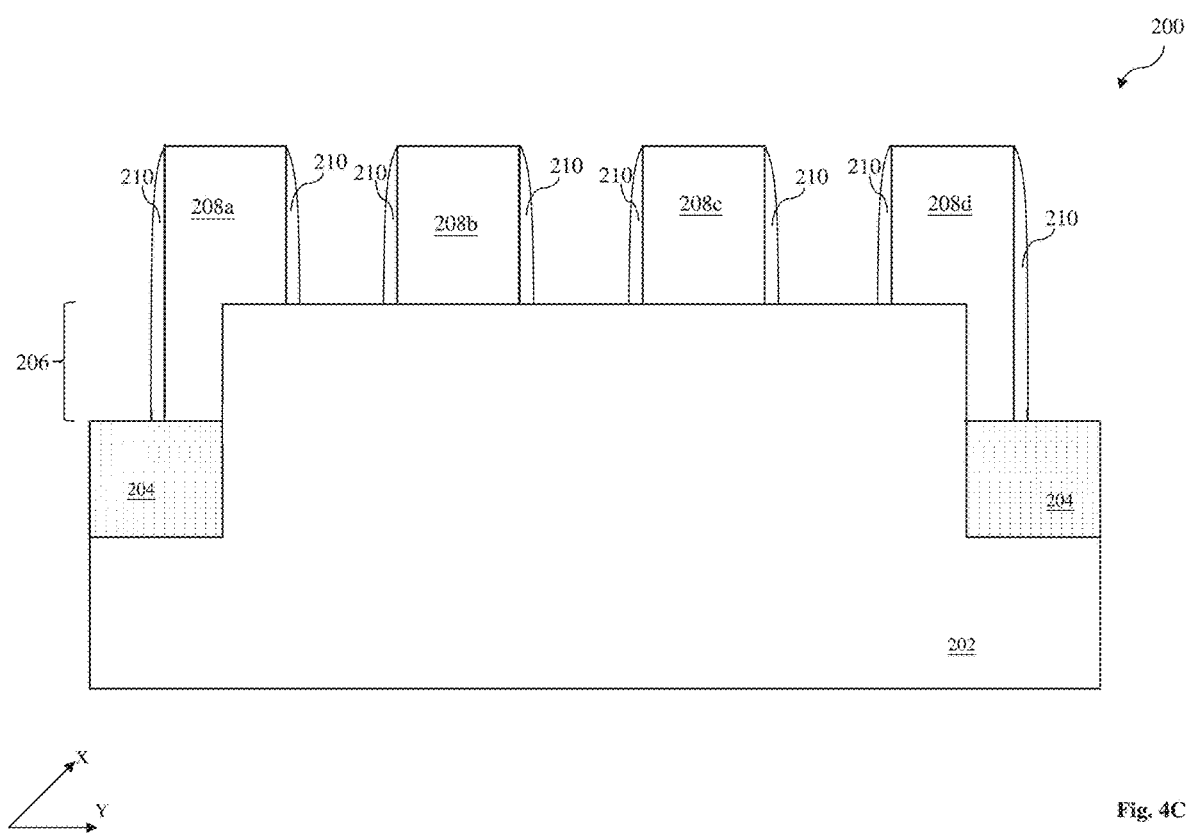

Referring to FIGS. 4A, 4B and 4C, the method 100 proceeds to an operation 108 by forming various gate stacks 208 on the fin active regions 206. FIG. 4B is a top view; FIG. 4A is a sectional view along the dashed line AA'; and FIG. 4C is a sectional view along the dashed line BB' of the semiconductor structure 200. In the present embodiment, the gate stacks 208 include exemplary gate stacks 208a, 208b, 208c and 208d, as illustrated in FIG. 4B. The gate stacks 208 have elongated shapes and are oriented in the first direction (X direction). Each of the gate stacks 208 is disposed over multiple fin active regions 206. Particularly, one gate stack 208 (such as gate stack 208a or 208d) is disposed on ends of the fin active regions 206 so that this gate stack is partially landing on the fin active region 206 and partially landing on the STI feature 204 along the Y direction. Those edges are configured as dummy structures to reduce edge effect and improve overall device performance.

The gate stacks 208 each include a gate dielectric layer and a gate electrode. The gate dielectric layer includes a dielectric material, such as silicon oxide, and the gate electrode includes a conductive material, such as polysilicon. The formation of the gate stacks 208 includes depositing the gate materials (including polysilicon in the present example); and patterning the gate materials by a lithographic process and etching. A gate hard mask layer may be formed on the gate material layer and is used as an etch mask during the formation of the gate stacks. The gate hard mask layer may include any suitable material, such as a silicon oxide, a silicon nitride, a silicon carbide, a silicon oxynitride, other suitable materials, and/or combinations thereof. In one embodiment, the gate hard mask includes multiple films, such as silicon oxide and silicon nitride. In some embodiments, the patterning process to form the gate stacks includes forming a patterned resist layer by lithography process; etching the hard mask layer using the patterned resist layer as an etch mask; and etching the gate materials to form the gate stacks 208 using the patterned hard mask layer as an etch mask.

One or more gate sidewall features (or gate spacers) 210 are formed on the sidewalls of the gate stacks 208. The gate spacers 210 may be used to offset the subsequently formed source/drain features and may be used for designing or modifying the source/drain structure profile. The gate spacers 210 may include any suitable dielectric material, such as a semiconductor oxide, a semiconductor nitride, a semiconductor carbide, a semiconductor oxynitride, other suitable dielectric materials, and/or combinations thereof. The gate spacers 210 may have multiple films, such as two films (a silicon oxide film and a silicon nitride film) or three films ((a silicon oxide film; a silicon nitride film; and a silicon oxide film). The formation of the gate spacers 210 includes deposition and anisotropic etching, such as dry etching.

The gate stacks 208 are configured in the fin active regions for various field effect transistors (FETs), therefore also referred to as FinFETs. In some examples, the field effect transistors include n-type transistors and p-type transistors. In other examples, those field effect transistors are configured to form one or more static random-access memory (SRAM) cells. Each SRAM cell includes two cross-coupled inverters configured for data storage. Furthermore, the gate stacks are configured to increase the pattern density uniformity and enhance the fabrication quality. For example, as noted above, the gate stacks 208 includes edge gate stacks 208a and 208b each being extended from the fin active region 206 to the STI feature 204 along the Y direction and lands on both the STI feature and the fin active region.

Figure 5:
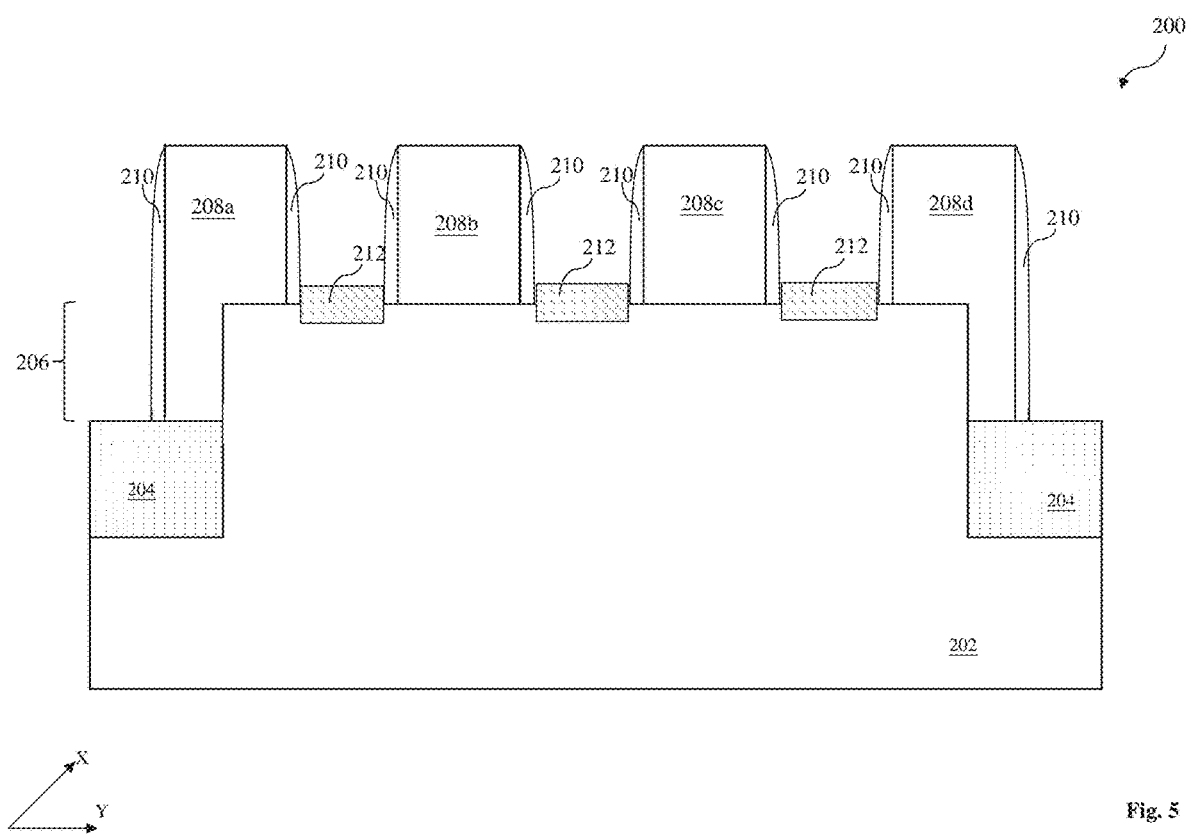

Referring to FIG. 5, the method 100 proceeds to an operation 110 by forming various source and drain features 212 to respective FinFETs. The source and drain features 212 may include both light doped drain (LDD) features and heavily doped source and drain (S/D). For example, each field effect transistor includes source and drain features formed on the respective fin active region and interposed by the gate stack 208. A channel is formed in the fin active region in a portion that is underlying the gate stack and spans between the source and drain features.

The raised source/drain features may be formed by selective epitaxy growth for strain effect with enhanced carrier mobility and device performance. The gate stacks 208 and gate spacer 210 constrain the source/drain features 212 to the source/drain regions. In some embodiments, the source/drain features 212 are formed by one or more epitaxy or epitaxial (epi) processes, whereby Si features, SiGe features, SiC features, and/or other suitable features are grown in a crystalline state on the fin active regions 206. Alternatively, an etching process is applied to recess the source/drain regions before the epitaxy growth. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the fin structure 206.

The source/drain features 212 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 212 are not in-situ doped, an implantation process (i.e., a junction implant process) is performed to introduce the corresponding dopant into the source/drain features 212. In an exemplary embodiment, the source/drain features 212 in an nFET include SiC or Si doped with phosphorous, while those in a pFET include Ge or SiGe doped with boron. In some other embodiments, the raised source/drain features 212 include more than one semiconductor material layers. For example, a silicon germanium layer is epitaxially grown on the substrate within the source/drain regions and a silicon layer is epitaxially grown on the silicon germanium layer. One or more annealing processes may be performed thereafter to activate the source/drain features 110. Suitable annealing processes include rapid thermal annealing (RTA), laser annealing processes, other suitable annealing technique or a combination thereof.

Figure 6:
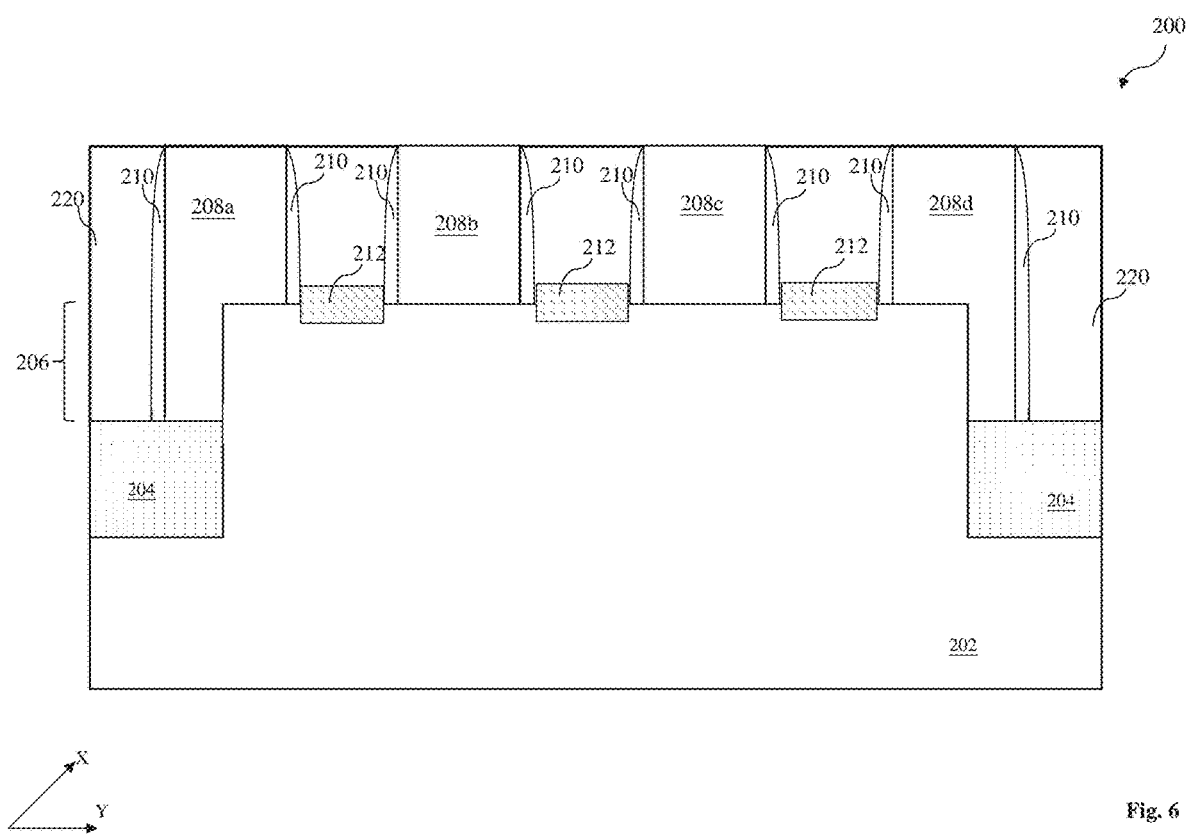

Referring to FIG. 6, the method proceeds to an operation 112, in which an inter-level dielectric material (ILD) layer 220 is formed on the substrate to cover the source/drain features 212 in the source/drain regions. The ILD 220 surround the gate stacks 208 and the gate spacers 210 allowing the gate stacks 208 to be removed and a replacement gate to be formed in the resulting cavity (also referred to as gate trench). Accordingly, in such embodiments, the gate stacks 208 are removed after forming the ILD layer 220. The ILD layer 220 may also be part of an electrical interconnect structure that electrically interconnects various devices of the semiconductor structure 200. In such embodiments, the ILD layer 220 acts as an insulator that supports and isolates the conductive traces. The ILD layer 220 may include any suitable dielectric material, such as a semiconductor oxide, a semiconductor nitride, a semiconductor oxynitride, other suitable dielectric materials, or combinations thereof. In some embodiments, the formation of the ILD layer 220 includes deposition and CMP to provide a planarized top surface.

Figure 7:
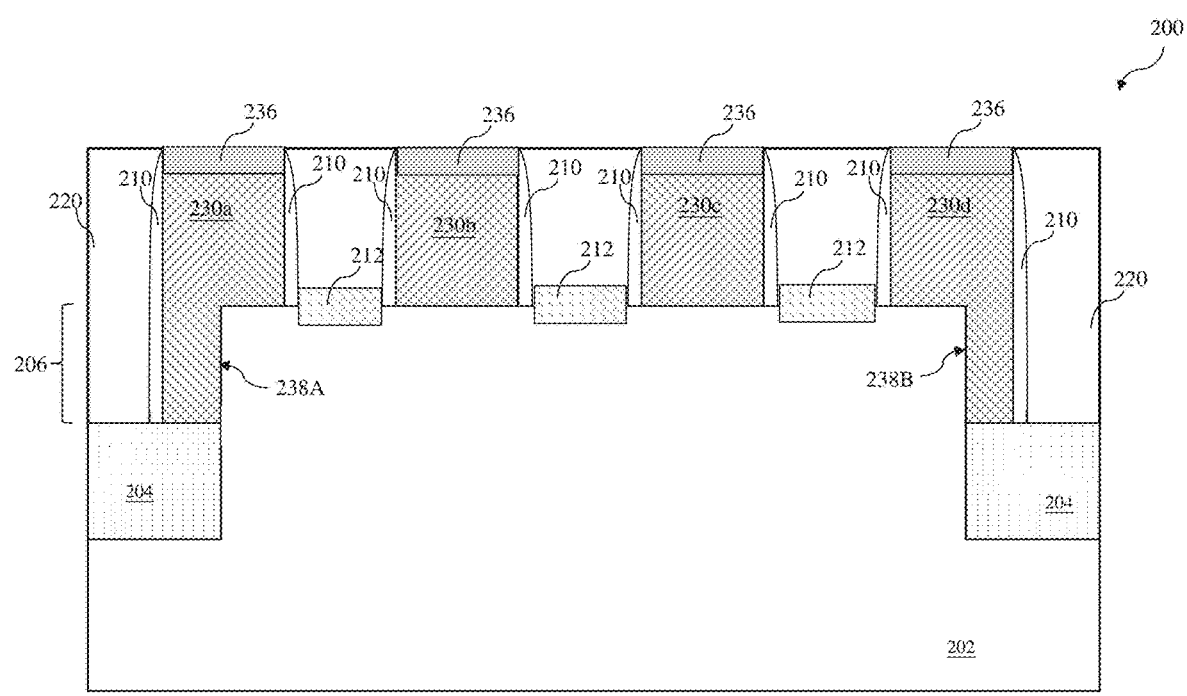
Figure 8A:
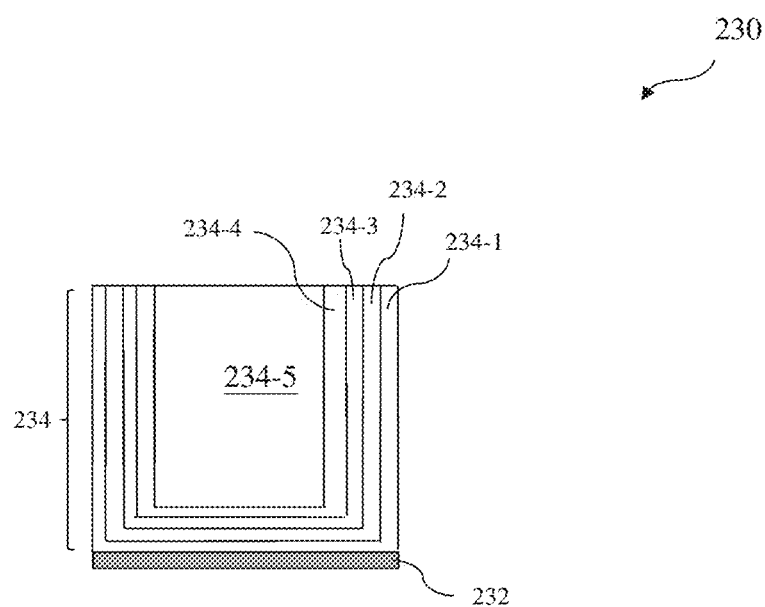
FIGS. 8A and 8B are sectional views of a gate stack of the semiconductor structure constructed according to some embodiments
Figure 8B:
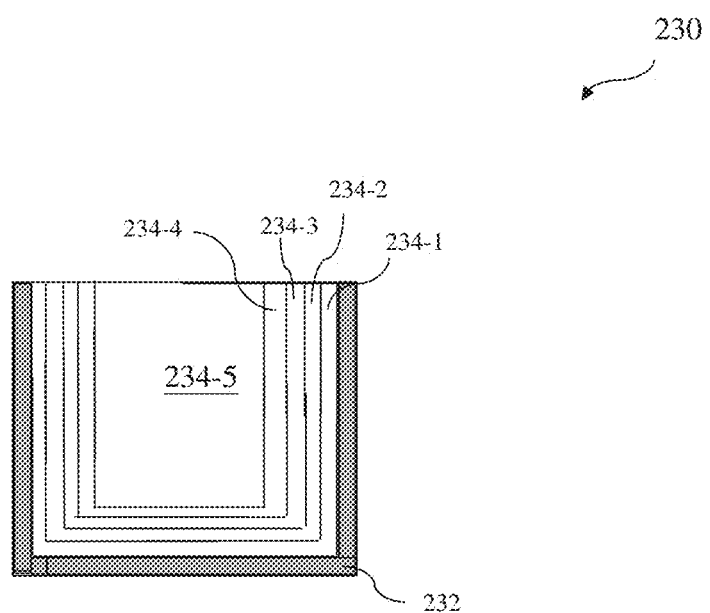

Referring to FIG. 7, the method proceeds to an operation 114 for gate replacement. The gate stacks 208 are replaced by gate stacks 230 with high k dielectric and metal, therefore also referred to as high-k metal gates. As illustrated in FIG. 7, the fin-type active region spans from one end 238A to another end 238B along the Y direction. The gate replacement process may include etching, deposition and polishing. In the present example for illustration, exemplary gate stacks 208a, 208b, 208c and 208d are removed, resulting in gate trenches. In some embodiments, the gate stacks 208 are removed by an etching process, such as a wet etch, to selectively remove the gate stacks 208. The etching process may include multiple etching steps to remove the dummy gate if more materials present. Then the gate materials, such as high k dielectric material and metal, are deposited in the gate trenches to form the gate stacks 230, such as exemplary gate stacks 230a, 230b, 230c and 230d. A CMP is further implemented to polish and remove the excessive gate materials from the semiconductor structure 200. The structure and the formation of the gate stacks 230 are further described below with a reference to FIGS. 8A and 8B. FIGS. 8A and 8B illustrate sectional views of an exemplary gate stack 230 in accordance with various embodiments.

The gate stack 230 (such as 230b) is formed on the substrate 202 overlying the channel region of the fin active region 206. The gate stack 230 includes a gate dielectric feature 232 and a gate electrode 234 disposed on the gate dielectric feature 232. In the present embodiment, the gate dielectric feature 232 includes high-k dielectric material and the gate electrode 234 includes metal or metal alloy. In some examples, the gate dielectric layer and the gate electrode each may include a number of sub-layers. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides (SiON), or other suitable dielectric materials. The gate electrode may include Ti, Ag, Al, TiAlN, TaC, TaCN, TaSiN, Mn, Zr, TiN, TaN, Ru, Mo, Al, WN, Cu, W, or any suitable materials. In some embodiments, different metal materials are used for nFET and pFET devices with respective work functions. The gate stack 230 is formed in the gate trench by a proper procedure, such as a procedure that includes deposition and CMP. Although it is understood that the gate stack 230 may be any suitable gate structure.

The gate dielectric feature 232 may further includes an interfacial layer sandwiched between the high-k dielectric material layer and the fin active region. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques. In some embodiments, the gate dielectric feature 232 is formed on the fin active region 206 at the operation 108 that forms the gate stack 208. In this case, the gate dielectric feature 232 is shaped as illustrated in FIG. 8A. In some other embodiments, the gate dielectric feature 232 is formed in the high-k last process, in which the gate dielectric feature 232 is deposited in the gate trench at the operation 118. In the case, the gate dielectric feature 232 is U-shaped, as illustrated in FIG. 8B.

The gate electrode 234 may include multiple conductive materials. In some embodiments, the gate electrode 234 includes a capping layer 234-1, a blocking layer 234-2, a work function metal layer 234-3, another blocking layer 234-4 and a filling metal layer 234-5. In furtherance of the embodiments, the capping layer 234-1 includes titanium nitride, tantalum nitride, or other suitable material, formed by a proper deposition technique such as ALD. The blocking layer 234-2 includes titanium nitride, tantalum nitride, or other suitable material, formed by a proper deposition technique such as ALD. In some examples, the block layers may not present or only one of them presents in the gate electrode.

The work functional metal layer 234-3 includes a conductive layer of metal or metal alloy with proper work function such that the corresponding FET is enhanced for its device performance. The work function (WF) metal layer 1606 is different for a pFET and a nFET, respectively referred to as an n-type WF metal and a p-type WF metal. The choice of the WF metal depends on the FET to be formed on the active region. For example, the semiconductor structure 200 includes a first active region for an nFET and another active region for a pFET, and accordingly, the n-type WF metal and the p-type WF metal are respectively formed in the corresponding gate stacks. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

The blocking layer 234-4 includes titanium nitride, tantalum nitride, or other suitable material, formed by a proper deposition technique such as ALD. In various embodiments, the filling metal layer 234-5 includes aluminum, tungsten or other suitable metal. The filling metal layer 234-5 is deposited by a suitable technique, such as PVD or plating.

Referring back to FIG. 7, the method 100 may also include an operation to form a hard mask 236 on top of the gate stacks 230 to protect the gate stacks 230 from loss during subsequent processing. The formation of the hard mask 236 includes recessing the gate stacks 230 by selective etching; deposition (such as CVD); and CMP according to the present example. The hard mask may include a suitable material different from the dielectric material of the ILD layers to achieve etching selectivity during the etching process to form contact openings. In some embodiments, the hard mask 236 includes silicon nitride. For examples, the hard mask 236 of silicon nitride (SiN) is formed by CVD using chemicals including Hexachlorodisilane (HCD or $Si_2Cl_6$), Dichlorosilane (DCS or $SiH_2Cl_2$), Bis(Tertiary-ButylAmino) Silane (BTBAS or $C_8H_{22}N_2Si$) and Disilane (DS or $Si_2H_6$).

Figure 9:
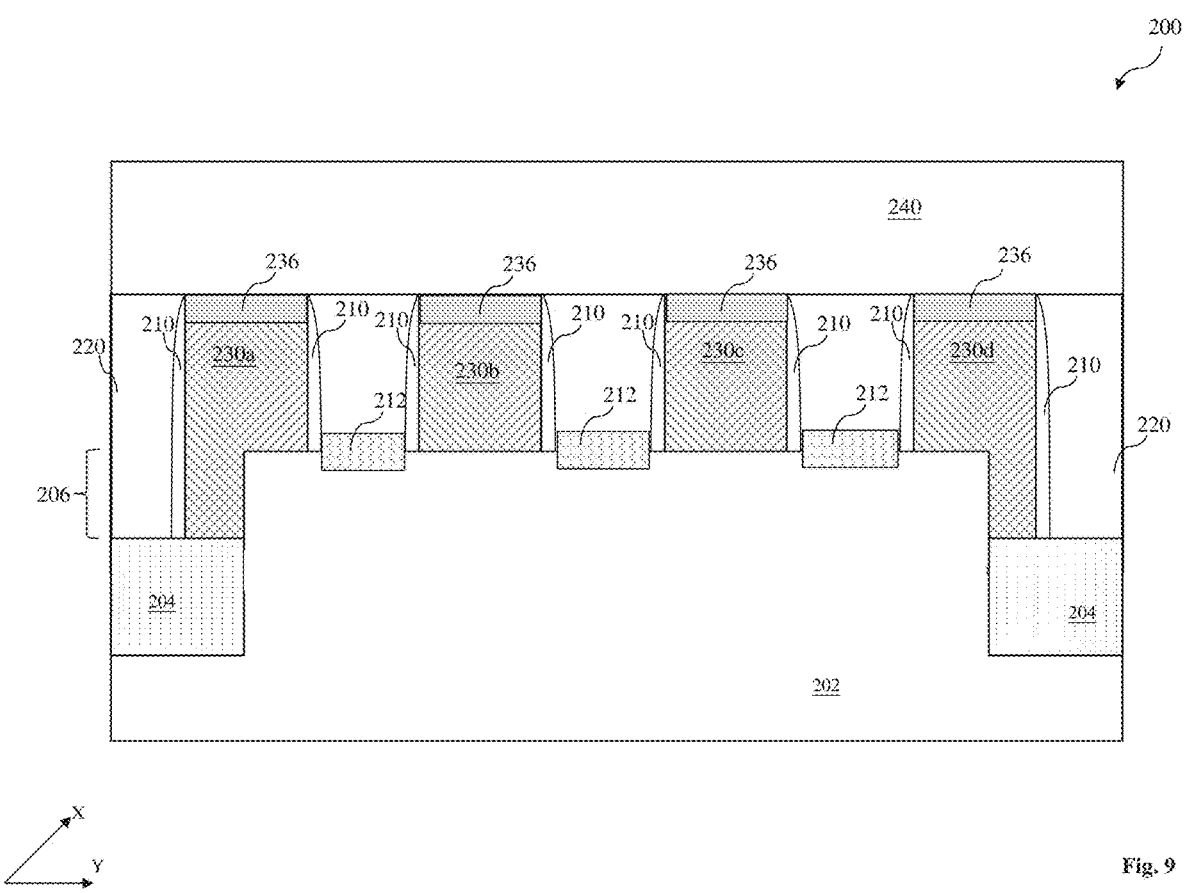

Referring to FIG. 9, the method 100 proceeds to an operation 116 by forming another ILD layer 240 similar to the ILD layer 220 in terms of composition and formation. For example, the formation of the ILD layer 240 may include deposition and CMP.

Figure 10A:
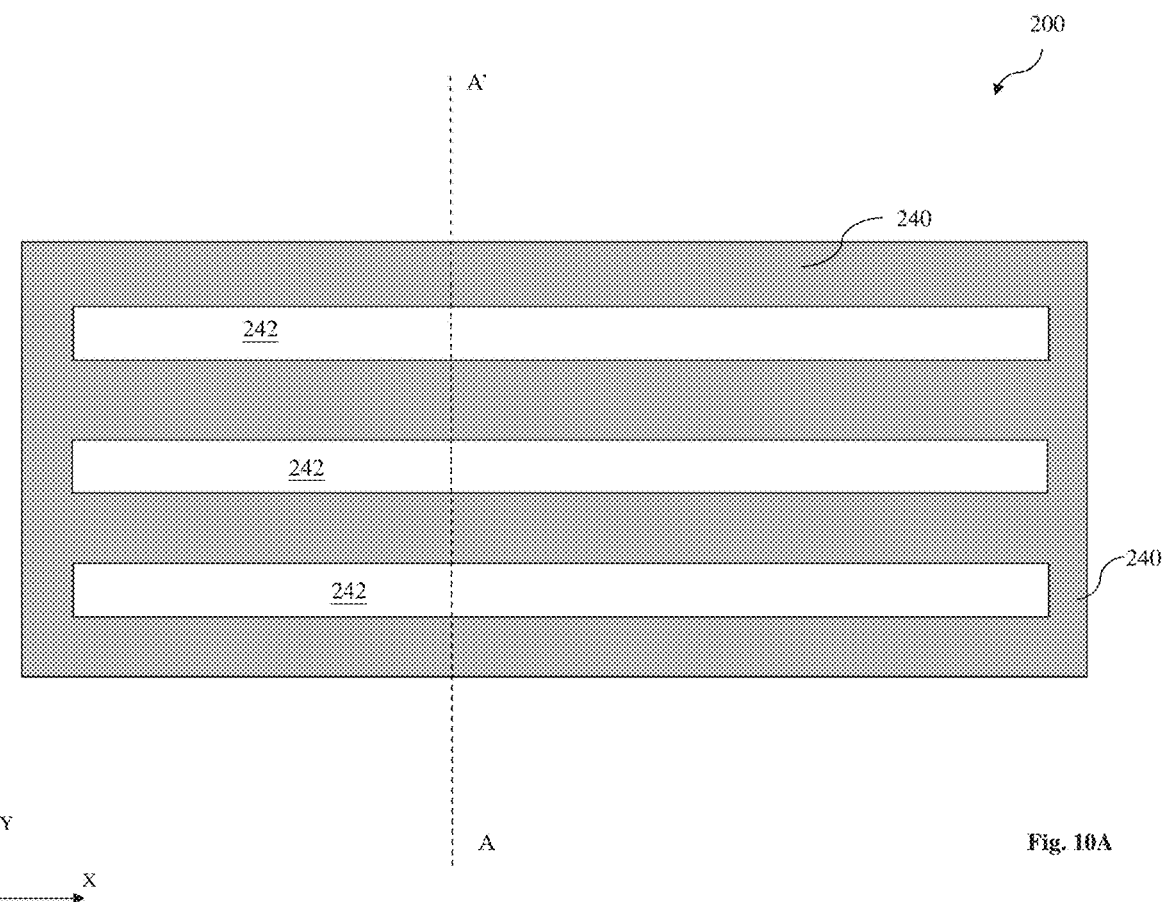
Figure 10B:
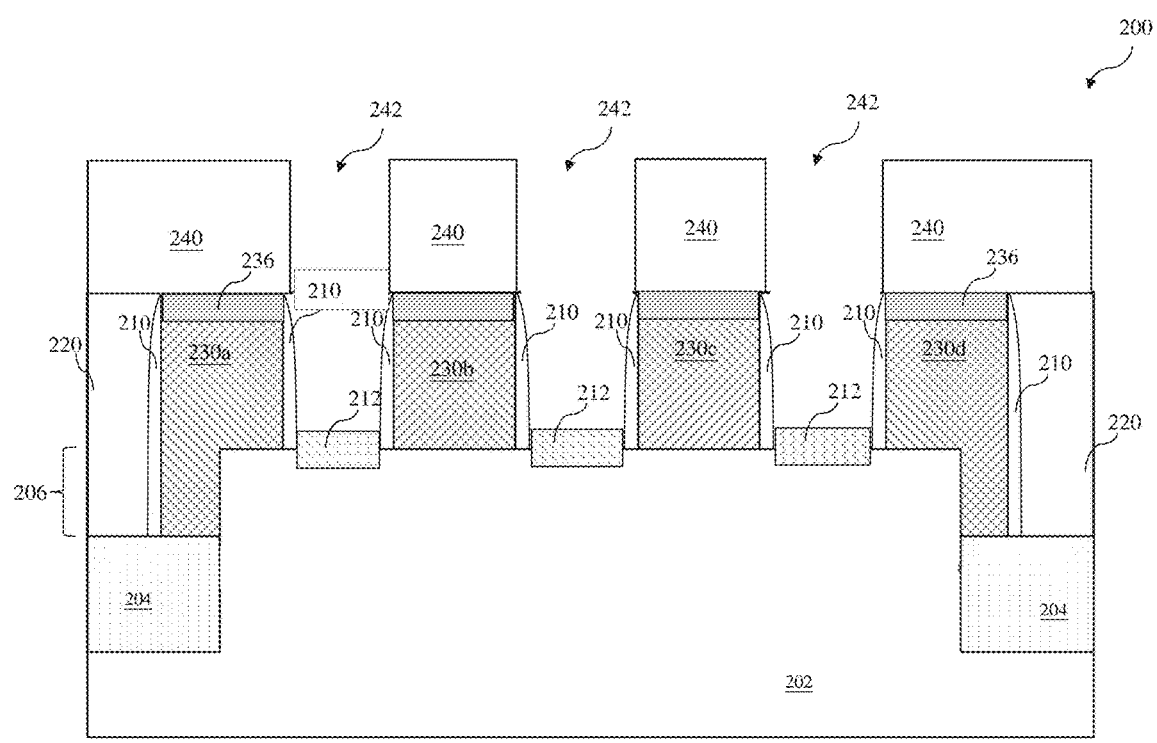

Referring to FIGS. 10A and 10B, the method 100 proceeds to an operation 118 by patterning the ILD layer 240 to form continuous openings 242 by lithography patterning and etching. A hard mask may be used to pattern the ILD layer 240. The etching process etches through the ILD layers 240 and 220 until the source/drain features 212 are exposed. FIG. 10A is a top view, in portion (only show the ILD layer 240 and the contact openings 242). FIG. 10B is a sectional view along the dashed line AA'.

Figure 11A:
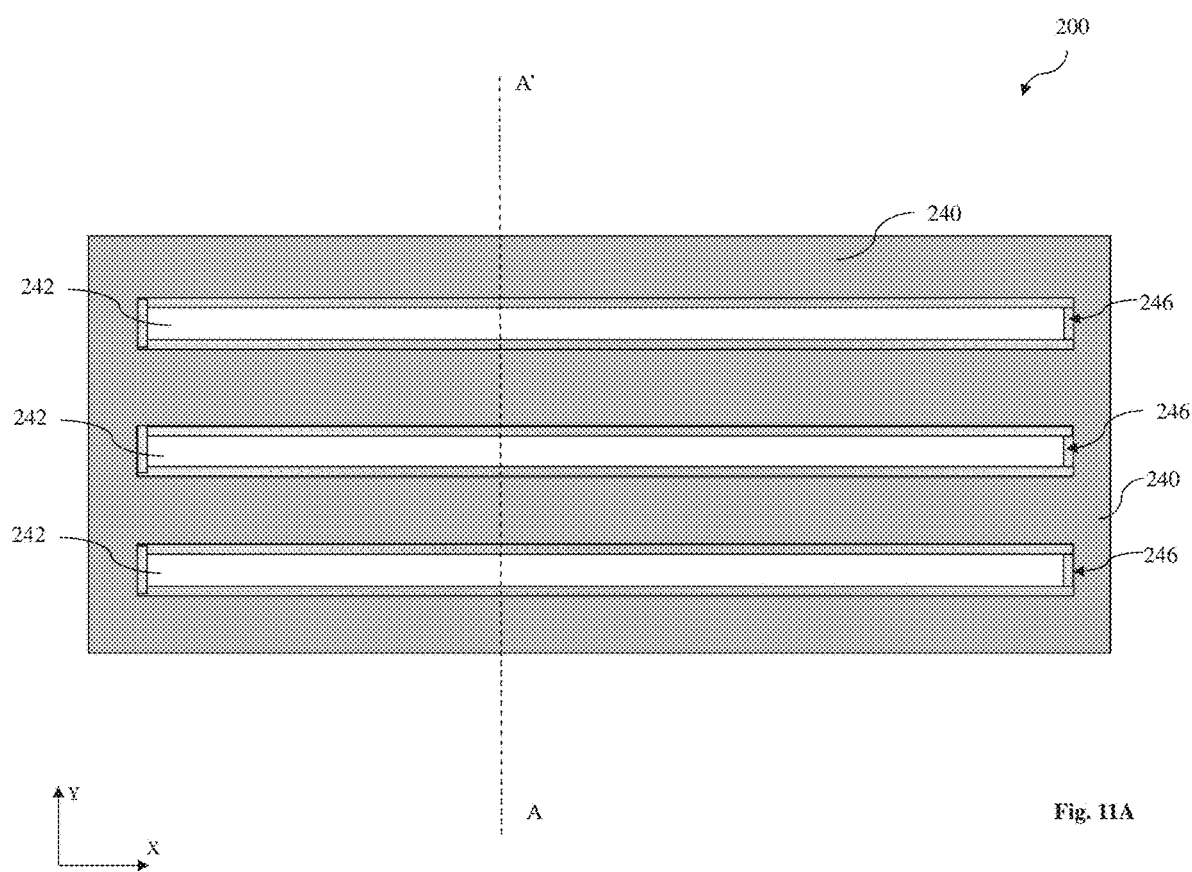
Figure 11B:
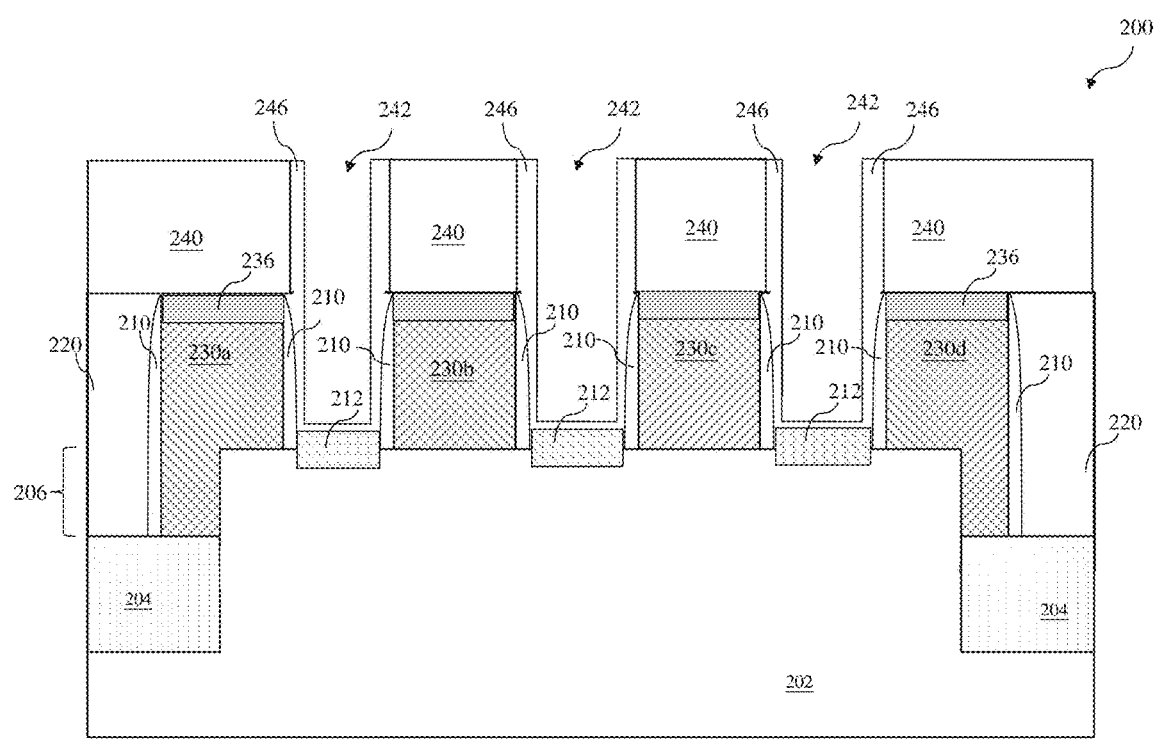

Referring to FIGS. 11A and 11B, the method 100 proceeds to an operation 120 by forming a high-k dielectric material layer 246 on sidewalls of the continuous contact openings 242 by deposition such that the high-k dielectric material layer is formed on the sidewalls. In some embodiments, the high k-dielectric material is different from that of the gate stacks 230. For examples, the high-k dielectric material layer 246 includes silicon nitride or other nitride-based dielectric material. In other examples, the high-k dielectric material layer 246 includes metal oxide dielectric material, such as Hf oxide, Ta oxide, Ti oxide, Zr oxide, Al oxide or a combination thereof. The high k-dielectric material layer 246 has a thickness ranging between 5 and 30 angstroms in some examples. FIG. 11A is a top view, in portion (only show the ILD layer 240; the high-k dielectric material layer 246; and the openings 242). FIG. 11B is a sectional view along the dashed line AA'.

Figure 12:
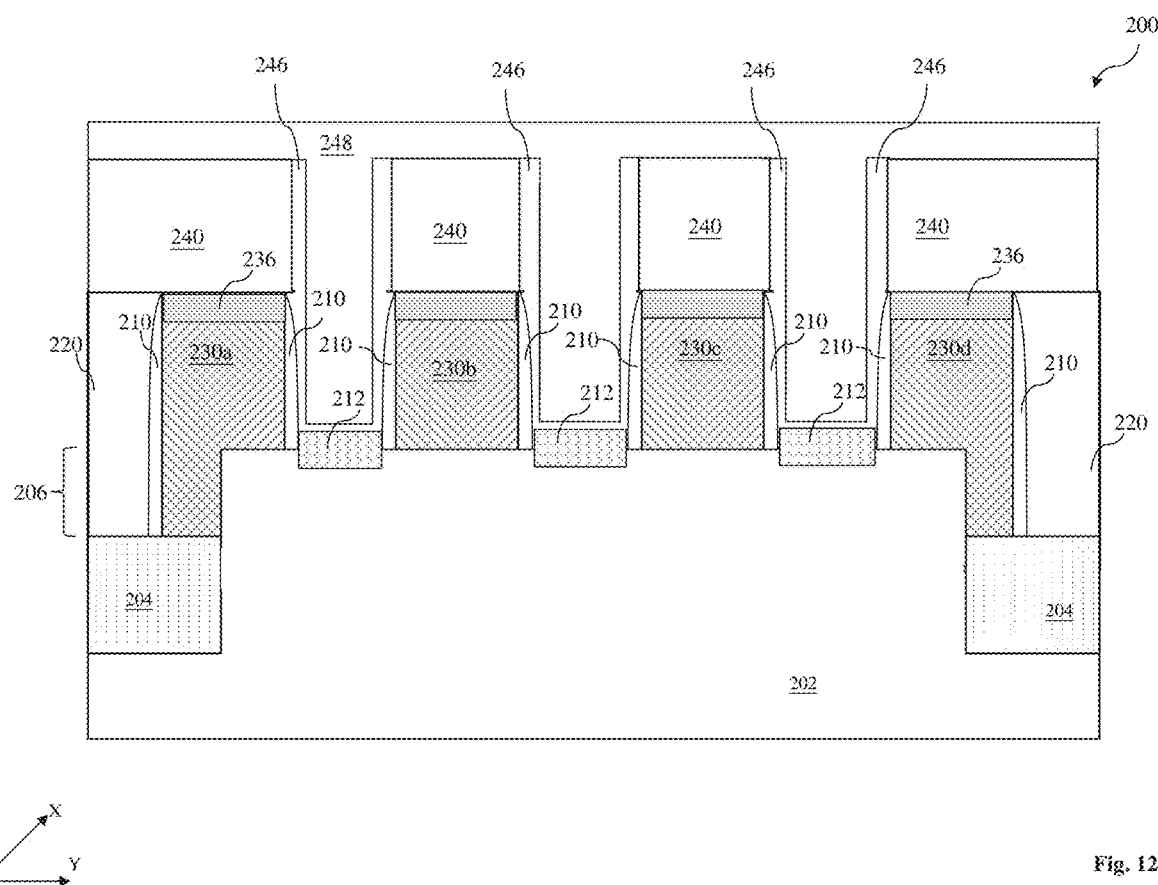
Figure 12:
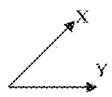

Referring to FIG. 12, the method 100 proceeds to an operation 122 by depositing a dielectric material layer 248 to fill in the continuous contact openings 242. Instead of filling a conductive material to the contact openings 242 to form contact features, the dielectric material layer 248 is filled in the contact openings. The dielectric material layer 248 may have a composition different from those dielectric materials of the ILD layers. For example, the dielectric material layer 248 includes silicon oxide formed by flowable CVD (FCVD).

Figure 13A:
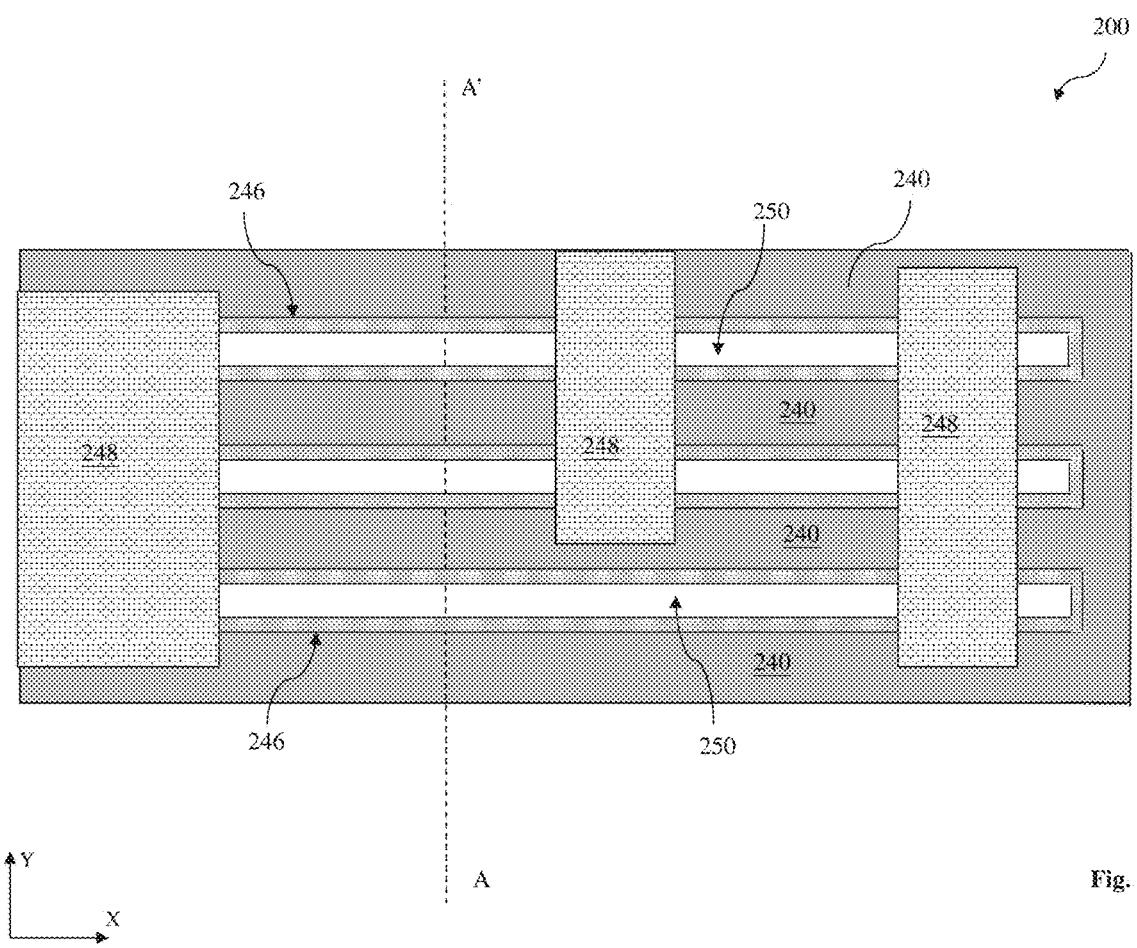
Figure 13B:
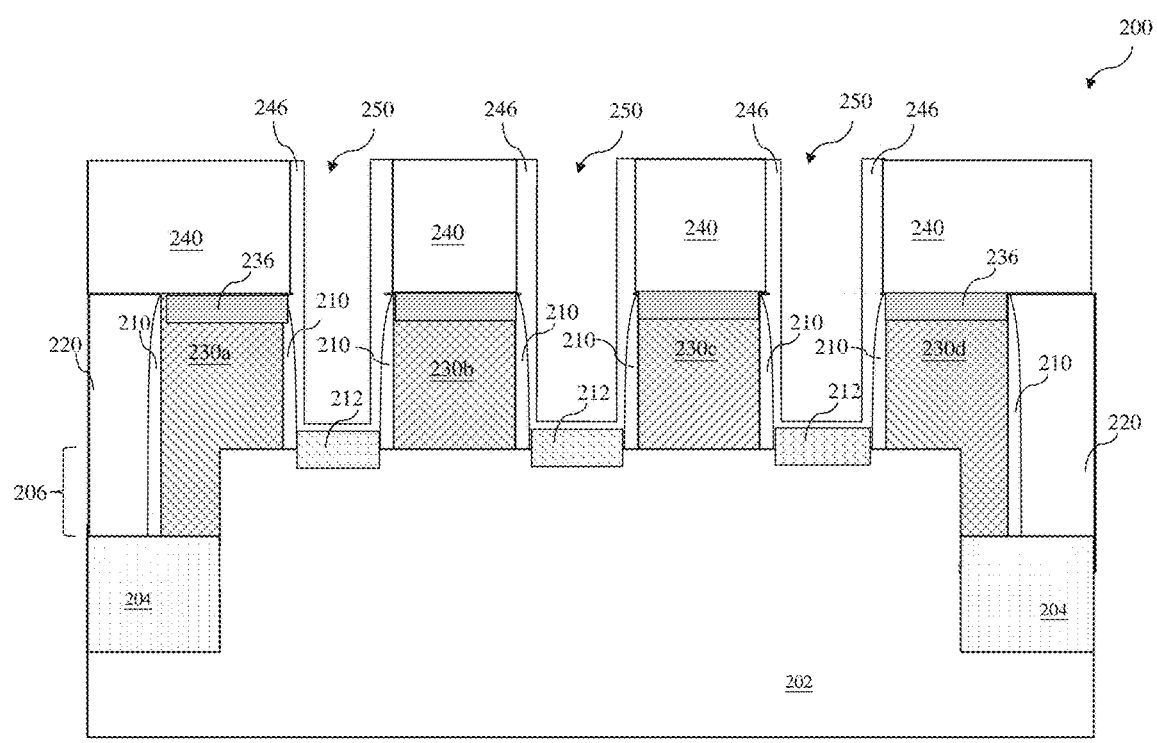
Figure 13B:
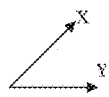

Referring to FIGS. 13A and 13B, the method 100 proceeds to an operation 124 by patterning the dielectric material layer 248 to define contact openings 250, which will be filled to form contact features. The contact openings 250 are different from the openings 242. The openings 242 are defined by the patterned ILD layer 240 while the contact openings 250 are collectively defined by the patterned ILD layer 240, the patterned dielectric material layer 248 and the high-k dielectric material layer 246. FIG. 13A is a top view, in portion (only show the ILD layer 240; the high-k dielectric material layer 246; the dielectric material layer 248 and the contact openings 250). FIG. 13B is a sectional view along the dashed line AA'. In the operation 124, the dielectric material layer 248 is patterned by lithography process and etching. In some example, a patterned mask is formed on the dielectric material layer 248 by lithography process and etching, in which the etching process selectively removes the dielectric material layer 248 so that the source/drain features 212 are exposed.

Figure 13C:
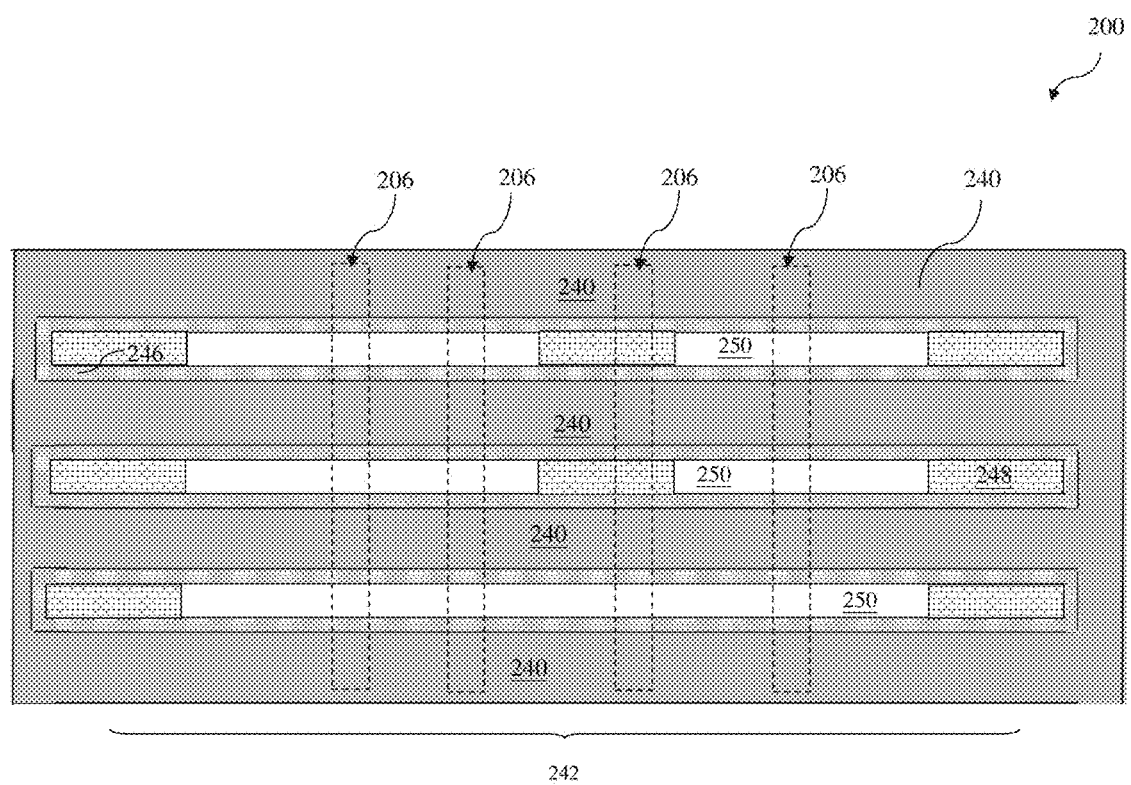

FIG. 13C is a top view of the semiconductor structure 200 constructed according to other embodiments. FIG. 13C is similar to FIG. 13A but it zooms out to include large area of the semiconductor structure 200 so for better illustrating both the original openings 242 and the contact openings 250. The openings 242 is defined in the ILD layer 240 and spans to continuous long openings while the contact openings 250 are defined collectively by the high-k dielectric material layer 246 and the dielectric material layer 248. Especially, the high-k dielectric material layer 246 only on sidewalls of the openings 250 along the X direction but not on the end sidewalls along the Y direction. Furthermore, thus formed contact openings 250 have elongated shape extending through one or more FinFETs, as illustrated in FIG. 13C. As the high-k dielectric material layer 246 is absent from the ends of the contact openings 250, the contact features to be formed in the openings 250 will have more contact areas for reduced contact resistance and enlarged margin for improved process windows. Therefore, it enlarges the landing margin between slot contacts to FinFET source/drain regions.

Figure 14:
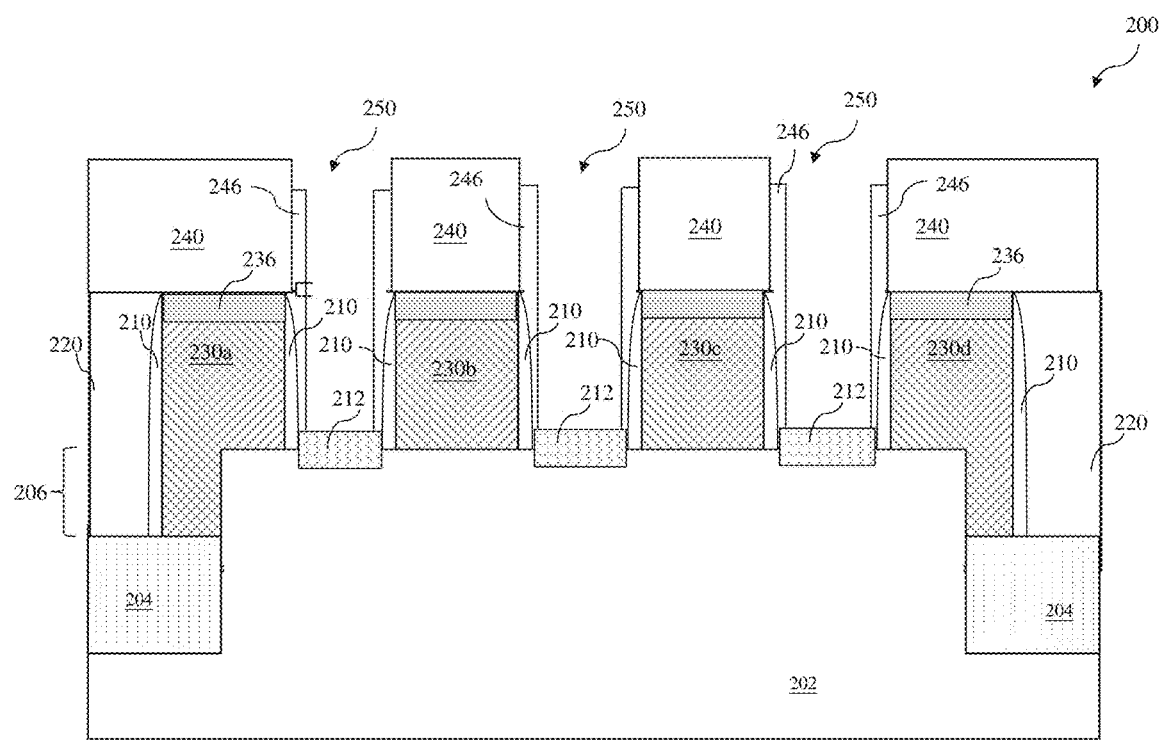

Referring to FIG. 14, the method 100 proceeds to an operation 126 by etching back the high-k dielectric material layer 246 such that the source/drain features 212 are exposed within the openings. During the etching-back process, the top surface of the high-k dielectric material layer 246 is also recessed as well.

Figure 15A:
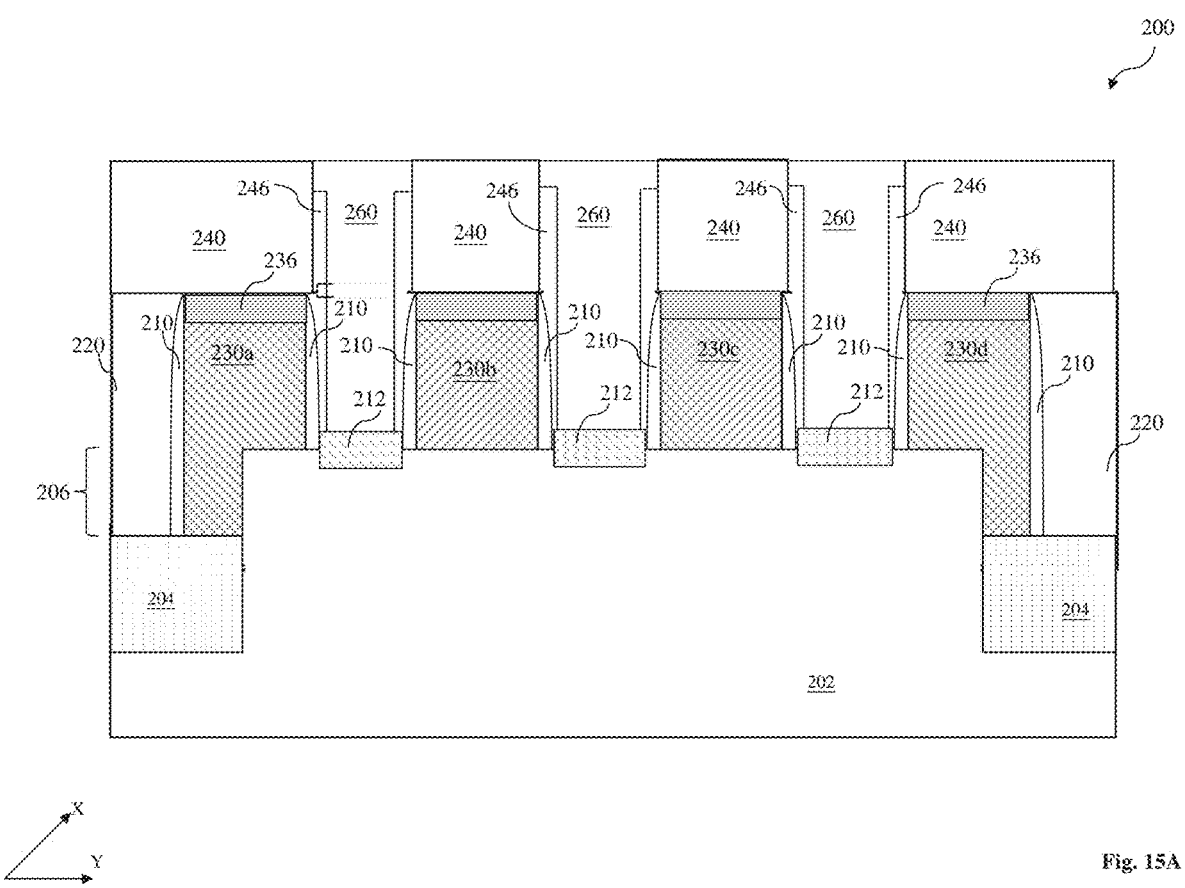
Figure 15B:
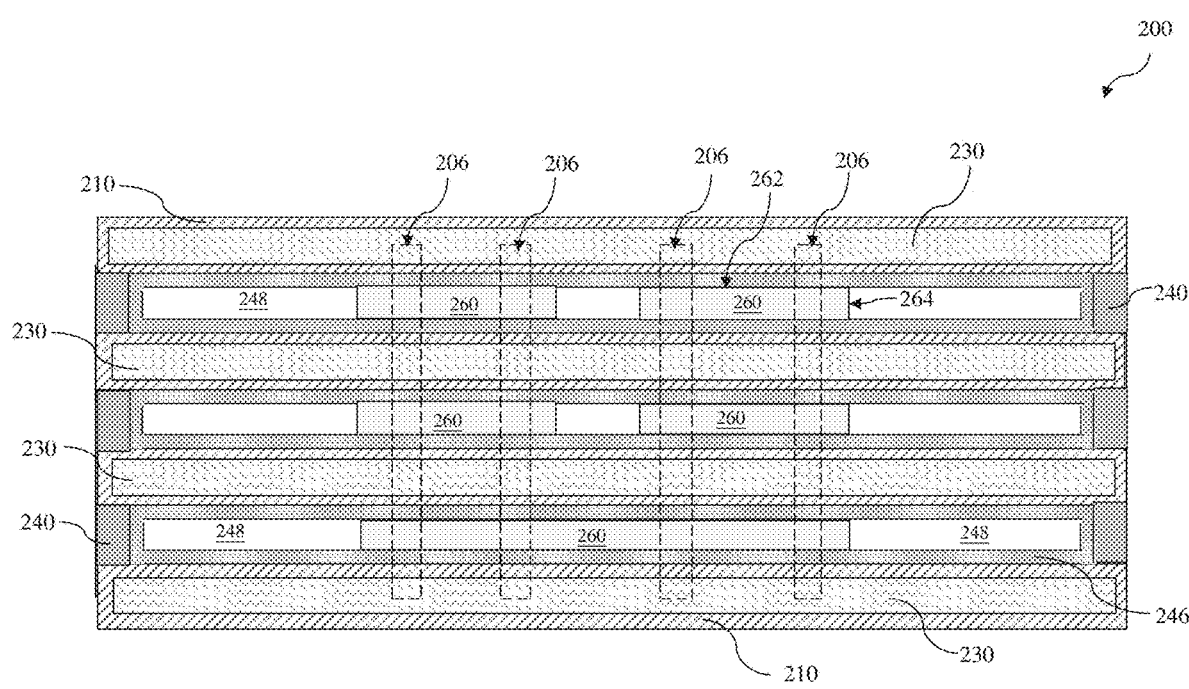

Referring to FIGS. 15A and 15B, the method 100 proceeds to an operation 128 by forming contact features 260 in the contact openings 250. The formation of the contact features 260 includes deposition of conductive material and CMP according to some examples. The deposition may be implemented through proper technique, such as physical vapor deposition (PVD), plating, CVD or other suitable method. The openings 250 are filled with one or more conductive material, such as Ti, TiN, TaN, Co, W, Al, Cu, or combination. As noted above, thus formed contact features 260 has elongated shape with length to width ratio greater than 2 for reduced contact resistance and improved process window. Especially, the elongated contact feature 260 is asymmetric along its width direction and its length direction. As illustrated in FIG. 15B, the elongated contact feature 260 includes two long edges 262 laterally contacting the high-k dielectric material layer 246 and two short edges (also referred to as ends) 264 laterally contacting the dielectric material layer 248. In other words, the sidewalls of the two ends 264 are free of the high-k dielectric material layer 246.

In some embodiments, prior to the filling in the conductive material in the openings 250, silicide may be formed on the source/drain features 212 to further reduce the contact resistance. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal.

Other fabrication steps may be implemented before, during and after the operations of the method. For example, various metal lines and vias in the interconnect structure are further formed on the semiconductor structure to electrically connect various FinFETs and other devices into a functional circuit by proper technique, such as dual damascene process. In various patterning processes above in the method 100, each patterning procedure may be implemented through double patterning or multiple patterning.

The present disclosure provides a contact structure and a method making the same in accordance with various embodiments. Thus formed contact features have elongated shape and asymmetric structure along its length direction and width direction. The high-k dielectric material layer is disposed on length sidewalls of the contact features but absent from two ends. The elongated contact features will have more contact areas for reduced contact resistance and enlarged margin for improved process windows. Therefore, it enlarges the landing margin between slot contacts to FinFET source/drain regions. This allows the designer to push the line-end space rule and therefore increases the line end landing areas of contacts to fin active regions. The disclosed structure can be used in various applications where FinFETs are incorporated for enhanced performance. For example, the FinFETs with multi-fin devices can be used to form static random-access memory (SRAM) cells. In other examples, the disclosed structure can be incorporated in various integrated circuits, such as logic circuit, dynamic random-access memory (DRAM), flash memory, or imaging sensor.

Thus, the present disclosure provides a semiconductor structure in accordance with some embodiments. The semiconductor structure includes a fin-type active region extruded from a semiconductor substrate; a gate stack disposed on the fin-type active region; a source/drain feature formed in the fin-type active region and disposed on a side of the gate stack; an elongated contact feature landing on the source/drain feature; and a dielectric material layer disposed on sidewalls of the elongated contact feature and free from ends of the elongated contact feature. The sidewalls of the elongated contact feature are parallel with the gate stack The present disclosure provides a semiconductor structure in accordance with some other embodiments. The semiconductor structure includes a first fin-type active region extruded from a semiconductor substrate and spanning from a first end to a second end along a first direction; a second fin-type active region extruded from the semiconductor substrate and spanning from a third end to a fourth end along the first direction; a first gate stack and a second gate stack each disposed on the first and second fin-type active regions, wherein the first and second gate stacks space away in the first direction and extend along a second direction that is orthogonal to the first direction; a first source/drain feature formed in the first fin-type active region and interposed between the first and second gate stacks; a second source/drain feature formed in the second fin-type active region and interposed between the first and second gate stacks; an elongated contact feature extending along the second direction and landing on the first and second source/drain features; and a dielectric material layer disposed on sidewalls of the elongated contact feature and is free from two ends of the elongated contact feature. The sidewalls of the elongated contact feature extend along the second direction.

The present disclosure provides a method forming an integrated circuit structure in accordance with some embodiments. The method includes forming a shallow trench isolation (STI) structure in a semiconductor substrate of a first semiconductor material, thereby defining a plurality of fin-type active regions separated from each other by the STI structure; forming gate stacks on the fin-type active regions; forming an inter-layer dielectric (ILD) layer filling in gaps between the gate stacks; patterning the ILD layer to form a trench between adjacent two of the gate stacks; depositing a first dielectric material layer that is conformal in the trench; filling the trench with a second dielectric material layer; patterning the second dielectric material layer to form a contact opening; and filling a conductive material in the contact opening to form a contact feature.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a first fin active region protruding from a semiconductor substrate;
a first gate stack disposed over the first fin active region;
a first gate spacer disposed on a sidewall of the first gate stack;
a first source/drain feature formed on the first fin active region;
a first contact feature landing on the first source/drain feature; and
a dielectric feature interposed between the first gate spacer and the first contact feature, being in direct contact with both the first gate spacer and the first contact feature, wherein the first dielectric feature is overlying the first gate spacer and has a loop structure enclosing the first contact feature.

2. The semiconductor structure of claim 1, wherein a first sidewall of the first dielectric feature is aligned with a first sidewall of the first contact feature.

3. The semiconductor structure of claim 2, further comprising
a second gate stack disposed over the first fin active region;
a second gate spacer disposed on a sidewall of the second gate stack; and
the dielectric feature extending between the second gate spacer and the first contact feature, being in direct contact with both the second gate spacer and the first contact feature.

4. The semiconductor structure of claim 3, wherein a second sidewall of the first dielectric feature is aligned with a second sidewall of the first contact feature.

5. The semiconductor structure of claim 4, wherein
the first contact feature includes a top portion and a bottom portion;
the bottom portion of the first contact feature spans first width between the first sidewall and the second sidewall of the dielectric feature; and
the top portion of the first contact feature spans a second width greater than the first width.

6. The semiconductor structure of claim 5, wherein the top portion of the first contact feature contacts a top surface of the dielectric feature.

7. The semiconductor structure of claim 6, further comprising a gate hard mask overlying the first gate stack, wherein the dielectric feature covers the first gate spacer and continuously extends to the gate hard mask.

8. The semiconductor structure of claim 6, further comprising
a second source/drain feature on the fin active region; and
a second contact feature landing on the second source/drain feature, wherein
the first and second contact features are distanced away with opposing sidewalls and are aligned with parallel sidewalls,
the first and second contact features are enclosed by the dielectric feature in a top view, and
the dielectric feature contacts the parallel sidewalls and are free from the opposing sidewalls.

9. A semiconductor structure, comprising:
an active region on a semiconductor substrate;
a gate stack disposed on the active region;
a gate dielectric cap overlying the gate stack;
a gate spacer of a first dielectric material disposed on sidewalls of the gate stack;
a contact feature landing on the active region; and
a dielectric layer of a second dielectric material disposed on a sidewall of the contact feature, wherein the dielectric layer is enclosing the contact feature in a top view.

10. The semiconductor structure of claim 9, wherein the second dielectric material is different from the first dielectric material in composition.

11. The semiconductor structure of claim 9, wherein the dielectric layer overlaps the gate spacer and spans between the gate dielectric cap and the contact feature.

12. The semiconductor structure of claim 9, wherein the dielectric layer directly contacts the gate spacer and the contact feature.

13. A semiconductor structure, comprising:
- an active region on a semiconductor substrate;
- a gate stack disposed on the active region;
- a gate dielectric cap overlying the gate stack;
- a gate spacer of a first dielectric material disposed on sidewalls of the gate stack;
- a contact feature landing on the active region; and
- a dielectric layer of a second dielectric material disposed between the gate spacer and contact feature, wherein the dielectric layer has a loop structure enclosing the contact feature in a top view.

14. The semiconductor structure of claim 13, wherein the dielectric layer is in direct contact with a sidewall of the gate spacer.

15. The semiconductor structure of claim 13, wherein the second dielectric material is different from the first dielectric material in composition, the first dielectric material includes silicon oxide, and the second dielectric material includes a metal oxide dielectric material.

16. The semiconductor structure of claim 13, wherein
- the dielectric layer overlaps the gate spacer and spans between the gate dielectric cap and the contact feature, and
- the dielectric layer directly contacts the contact feature.

17. The semiconductor structure of claim 13, wherein the gate dielectric cap includes a third dielectric material different from the first and second dielectric materials in composition.

18. The semiconductor structure of claim 13, further comprising
- a second gate stack disposed partially on a first end of the active region and partially on a STI feature; and
- a third gate stack disposed partially on a second end of the active region and partially on the STI feature.

19. The semiconductor structure of claim 13, wherein the contact feature has an elongated shape with an L/W ratio defined as its length over its width, and wherein the L/W ratio is greater than 2.

20. The semiconductor structure of claim 13, wherein the dielectric feature is recessed from the contact feature such that a top surface of the dielectric feature is below a top surface of the contact feature.

* * * * *